United States Patent
Hsu

(10) Patent No.: US 7,239,525 B2
(45) Date of Patent: Jul. 3, 2007

(54) CIRCUIT BOARD STRUCTURE WITH EMBEDDED SELECTABLE PASSIVE COMPONENTS AND METHOD FOR FABRICATING THE SAME

(75) Inventor: Shih-Ping Hsu, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 0 days.

(21) Appl. No.: 11/274,014

(22) Filed: Nov. 14, 2005

(65) Prior Publication Data

US 2006/0104042 A1 May 18, 2006

(30) Foreign Application Priority Data

Nov. 17, 2004 (TW) .............................. 93135183 A

(51) Int. Cl.
*H05K 1/18* (2006.01)
(52) U.S. Cl. ...................... 361/763; 361/767; 174/250
(58) Field of Classification Search ................ 361/763, 361/761, 807, 748, 760; 174/250
See application file for complete search history.

(56) References Cited

U.S. PATENT DOCUMENTS

| | | | |
|---|---|---|---|
| 3,857,683 A | | 12/1974 | Castonguay |
| 5,243,320 A | | 9/1993 | Clouser et al. |
| 5,683,928 A | | 11/1997 | Wojnarowski et al. |
| 6,005,197 A | * | 12/1999 | Kola et al. ................... 174/260 |
| 6,370,013 B1 | * | 4/2002 | Iino et al. ................. 361/306.3 |
| 6,610,934 B2 | * | 8/2003 | Yamaguchi et al. ......... 174/264 |
| 6,791,178 B2 | * | 9/2004 | Yamaguchi et al. ......... 257/699 |
| 6,963,493 B2 | * | 11/2005 | Galvagni ..................... 361/782 |
| 2003/0090883 A1 | * | 5/2003 | Asahi et al. ................. 361/761 |

* cited by examiner

*Primary Examiner*—Dean A. Reichard
*Assistant Examiner*—Sheldon Soon
(74) *Attorney, Agent, or Firm*—Sawyer Law Group LLP

(57) ABSTRACT

A circuit board structure with embedded selectable passive components and a method for fabricating the same are proposed, wherein a plurality of passive components are embedded in a circuit board and a plurality of electrical connections are formed on a surface of the circuit board and electrically connected to the passive components. A circuit structure is formed close to the electrical connections for selectively forming a conductive layer thereon to electrically connect a portion of the passive components according to different electrical situations, in order to provide a set of passive components for electrical design of electronic devices.

19 Claims, 3 Drawing Sheets

CIRCUIT BOARD STRUCTURE WITH EMBEDDED SELECTABLE PASSIVE COMPONENTS AND METHOD FOR FABRICATING THE SAME

FIELD OF THE INVENTION

The present invention relates to a circuit board structure with embedded selectable passive components and a method for fabricating the same, and, more particularly, to a circuit board structure and a method for fabricating the same for altering values of resistors, capacitors and/or inductors according to practical requirements of electrical designs.

BACKGROUND OF THE INVENTION

Along with the progress of semiconductor packaging technology and improvements in electrical performance of semiconductor chips, semiconductor devices are becoming highly integrated. The traditional lead frame semiconductor device is gradually being replaced with ball grid array (BGA) and a flip chip ball grid array (FCBGA) package structures, wherein a plurality of input/output (I/O) connections are formed on these semiconductor devices for accommodating electronic circuits and semiconductor chips therein.

In accordance with the high integration of the semiconductor device, more leads and circuits are required, thus increasing the generation of noise. Generally, in order to reduce the noise or compensate the electrical properties, passive components such as resistors, capacitors, and inductors are incorporated in the semiconductor device to reduce noise and stabilize the circuitry to meet the requirements for the electrical characteristics of the packaged semiconductor chip.

Conventionally, the passive components are mounted on the circuit board in areas not occupied by semiconductor chips. However, this arrangement requires a relatively large circuit board and undesirably increases the overall size of the product incorporating the circuit board. Moreover, the passive components mounted on the circuit board also increases the complexity of the circuit layout and fabrication processes for the semiconductor device. Referring to FIG. 1, a plurality of passive components 12 are disposed on a surface of a circuit board 1, wherein the circuit board 1 can be a normal printed circuit board or a chip-carrying circuit board. Conventionally, in order to reduce the degree that the passive components 12 affect the electrical connections between the semiconductor chips 11 and a plurality of bond fingers formed on the circuit board 1, the passive components 12 are situated at corner positions of the circuit board 1 or at regions outside where the semiconductor chips 11 are mounted. However, considering the space and specific locations required for the bond pads, the number of and mounting locations for passive components 12 is undesirably restricted. Moreover, since the number of passive components 12 generally increases with enhanced performance of a semiconductor device, use of the above conventional arrangement to incorporate more semiconductor chips 11 and more passive components 12 on the circuit board 1 would not only increase the size of the semiconductor device, but also fail to comply with the requirement for a small product profile.

Furthermore, in response to the enhanced functionality and smaller sizes of electronic products, lamination technology needs to be improved for fabricating circuit boards with smaller thicknesses, multiple layers and higher densities. Therefore, for making the circuit boards more compact in size, a type of multi-layer circuit board embedded with passive components has been developed, wherein the passive components are mounted in the form of films between laminations of the multi-layer circuit board.

The multi-layer circuit boards integrated with various films of passive components can be arranged in different configurations. Referring to FIG. 2, a capacitive film 22 is embedded in a multi-layer circuit board 2, wherein it can be a dielectric layer with a high dielectric constant that is made of a polymeric material, ceramic material, polymer filled with ceramic powders and the like. Patterned conductive circuit layers 21 are formed on opposite surfaces of the capacitive film 22 and comprise several circuit regions serving as electrodes 21b of capacitors 22a, in order to form a multi-layer circuit board structure with embedded capacitors.

Materials and methods for forming passive components such as capacitors in the laminated structure of a circuit board are being highly refined. Referring to related prior arts in this field including U.S. Pat. Nos. 3,857,683, 5,243,320 and 5,683,928, it is usual to form passive components on an organic insulating layer by printing and/or photoresist-etching techniques before fabricating a new lamination for a multi-layer circuit board.

However, although embedding films of passive components between laminations of the multi-layer circuit board is capable of solving the aforementioned problem that restricts trace routability of the circuit board, it still has a drawback. Since the passive components are disposed between laminations of the circuit board, in cases where different electrical characteristics such as capacitance, resistance or inductance are required, the multi-layer circuit board needs to be re-designed and re-laminated, which significantly increases fabrication costs and causes difficulty in managing material stocks.

Therefore, the problem to be solved is to provide for a significant number of passive components in the semiconductor device or electronic device to enhance the electrical performance without affecting trace routability and increasing fabrication and material costs of the semiconductor device or electronic device in accordance with the current trend of reducing the size and improving the functionality for electronic products.

SUMMARY OF THE INVENTION

In light of the above prior-art drawbacks, a primary objective of the present invention is to provide a circuit board structure with embedded selectable passive components and a method for fabricating the same, by which a designer is able to adjust a set of passive components according to the practical requirements of the current electrical design.

Another objective of the present invention is to provide a circuit board structure with embedded selectable passive components and a method for fabricating the same, which uses a simple fabrication processes to achieve a set of passive components required by an electrical design.

A further objective of the present invention is to provide a circuit board structure with embedded selectable passive components and a method for fabricating the same for eliminating the prior-art drawbacks that in case different electrical characteristics such as capacitance, resistance or inductance are required, the multi-layer circuit board needs to be re-designed and re-laminated which significantly increases fabrication costs, materials management difficulty, and the cost of material stocks.

In accordance with the above and other objectives, the method for fabricating a circuit board structure with embedded selectable passive components of the present invention mainly comprises: providing a circuit board with a plurality of embedded selectable passive components; forming a plurality of electrical connections on the surface of the circuit board for electrically connecting to the passive components, and forming a circuit structure close to the electrical connections; and selectively forming a conductive layer between the electrical connections and the circuit structure to electrically connect a portion of the passive components or conductive circuit according to different electrical situations, so as to provide a set of passive components for electrical design of electronic devices. The passive components may be one of a set of capacitors, resistors, or inductors, and electrical connections are provided by the interlayer electric structures formed on the circuit board for electrically extending the passive components to the surface of the circuit board. The circuit structure on the surface of the circuit board includes electrode pads and conductive circuitry for providing selections for electrically connecting the electrical connections and the conductive circuitry, so as to electrically assemble the type, amount, and connection method (parallel connection and/or series connection) of the desired passive components.

The present invention also provides a circuit board structure with embedded selectable passive components by the foregoing method which mainly comprises: a circuit board with a plurality of embedded selectable passive components; a plurality of electrical connections formed on the surface of the circuit board for electrically connecting to the passive components by interlayer electric structures formed on the circuit board; a circuit structure formed on the surface of the circuit board close to the electrical connections; and a plurality of conductive layers selectively formed between the electrical connections and the circuit structure.

In response to passive components required by different electrical designs, a conductive layer is optionally applied between the circuit structure and the electrical connection that is electrically connected to the passive components to form electrical connection of the passive components embedded in the circuit board, so that the set structure of the desirable passive components can be simplified. Additionally, a plurality of plated through holes may be formed to electrically connect the circuit structures on the upper and lower surfaces and laminations of the circuit board, in order to further provide flexibility in altering the electrical design.

Therefore, the circuit board structure with embedded selectable passive components and a method for fabricating the same mainly comprises: embedding a plurality of passive components in the circuit board; forming electrical connections extended from the passive components on the surface of the circuit board and forming a circuit structure which includes a plurality of electrode pads and conductive circuits partly connected to the electrode pads; thereafter, selectively forming a conductive layer between the electrical connection on the surface of the circuit board and the circuit structure according to different electrical designs (including electrical connection between conductive circuits of the circuit structure), so as to provide an electrically conductive connection and an electrical set of passive components. In particular, the capacitance value for the electrical design can be achieved if the embedded passive component is a capacitor, the resistance value for the electrical design can be achieved if the embedded passive component is a resistor, and the inductance value for the electrical design can be achieved if the embedded passive component is an inductor. Furthermore, the passive components embedded in the circuit board may be incorporated with one set of capacitors, resistors, and inductors for complying with different electrical requirements of electronic devices. Accordingly, desired passive components can be electrically connected by the conductive layers formed between the electrical connections on the surface of the circuit board and the circuit structure according to the electrical design. Thus, the pre-connections of the passive components not used to alter and correct electrical performance are not needed during circuit board fabrication.

DETAILED DESCRIPTION OF THE PREFERRED EMBODIMENTS

The following special embodiment is provided to illustrate the present invention. Other advantages and effects can be understood by those in the art after reading the disclosure of this specification. The present invention can also be performed or applied by other embodiments. The details of the specification are provided using a particular application, and numerous modifications and variations can be devised without departing from the spirit of the present invention. It should be noted that the drawings of the present invention are simplified for the sake of easy illustration and are not drawn according to actual dimensions, and, therefore, do not show the real sizes or relative distances of the associated components.

Figure 1:
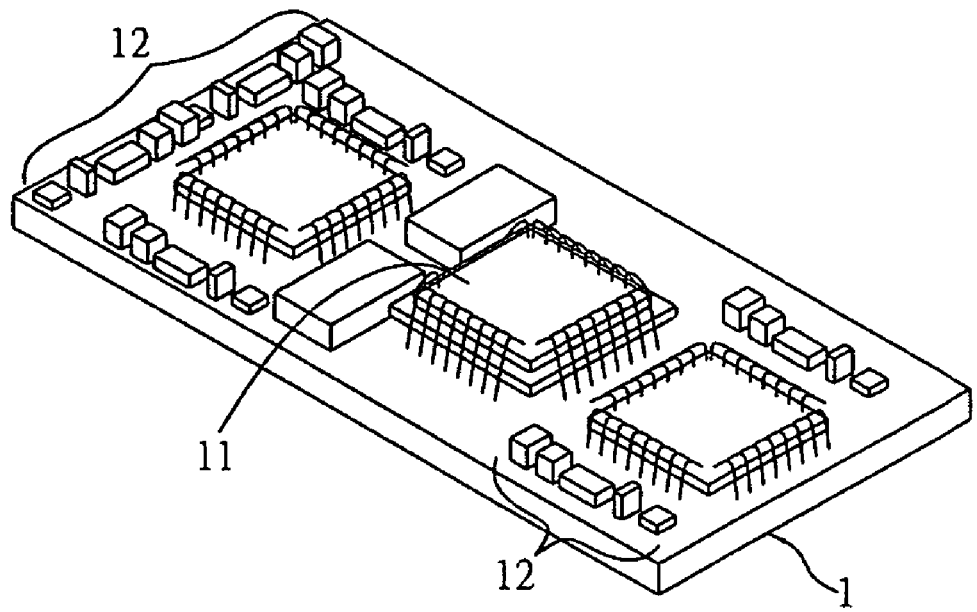
FIG. 1 (PRIOR ART) is a schematic diagram of a conventional circuit board with passive components mounted on an area not occupied by a semiconductor chip.
Figure 2:
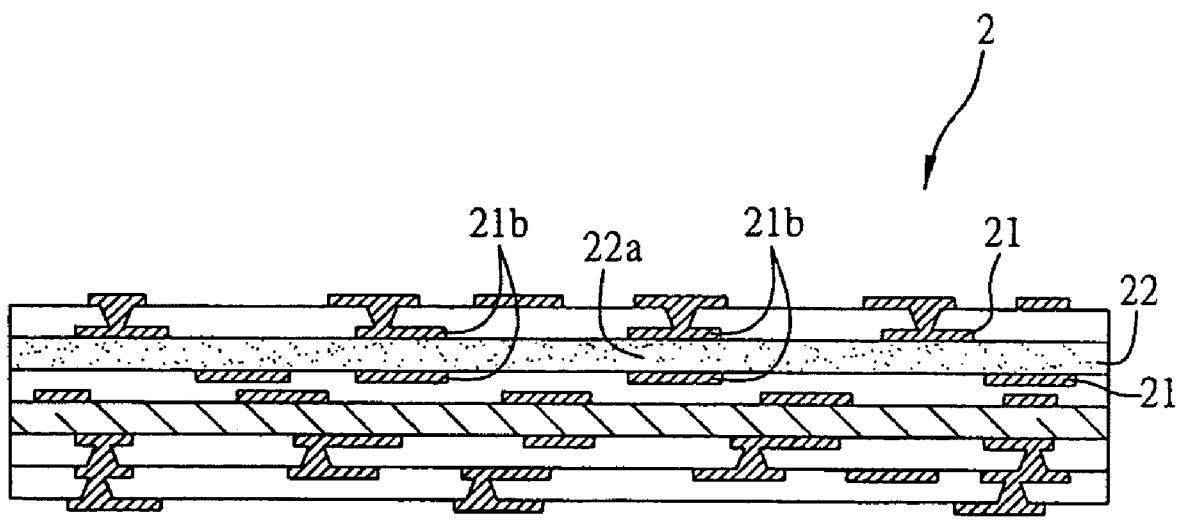
FIG. 2 (PRIOR ART) is a cross-sectional view of a conventional multi-layer circuit board with capacitive film embedded between laminations of the circuit board.
Figure 3A:
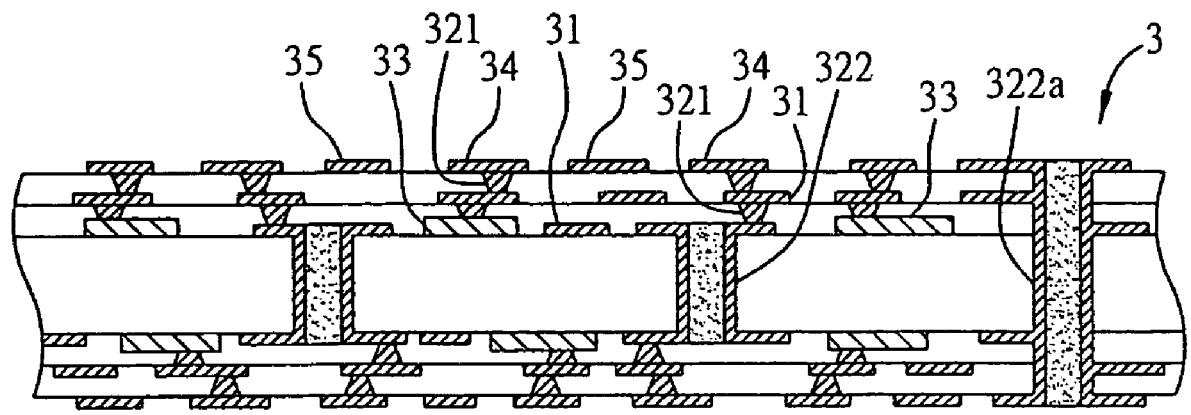
FIG. 3A is a cross-sectional view showing a circuit board structure with embedded selectable passive components according to the present invention.
Figure 3B:
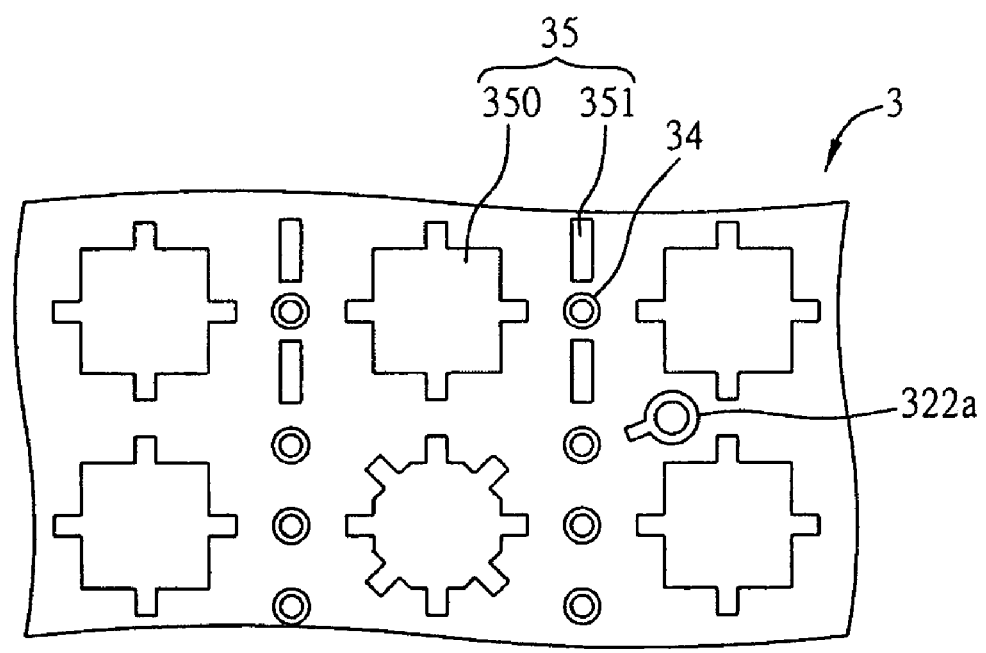
FIG. 3B is a top view showing a circuit board structure with embedded selectable passive components according to the present invention.
Figure 4:
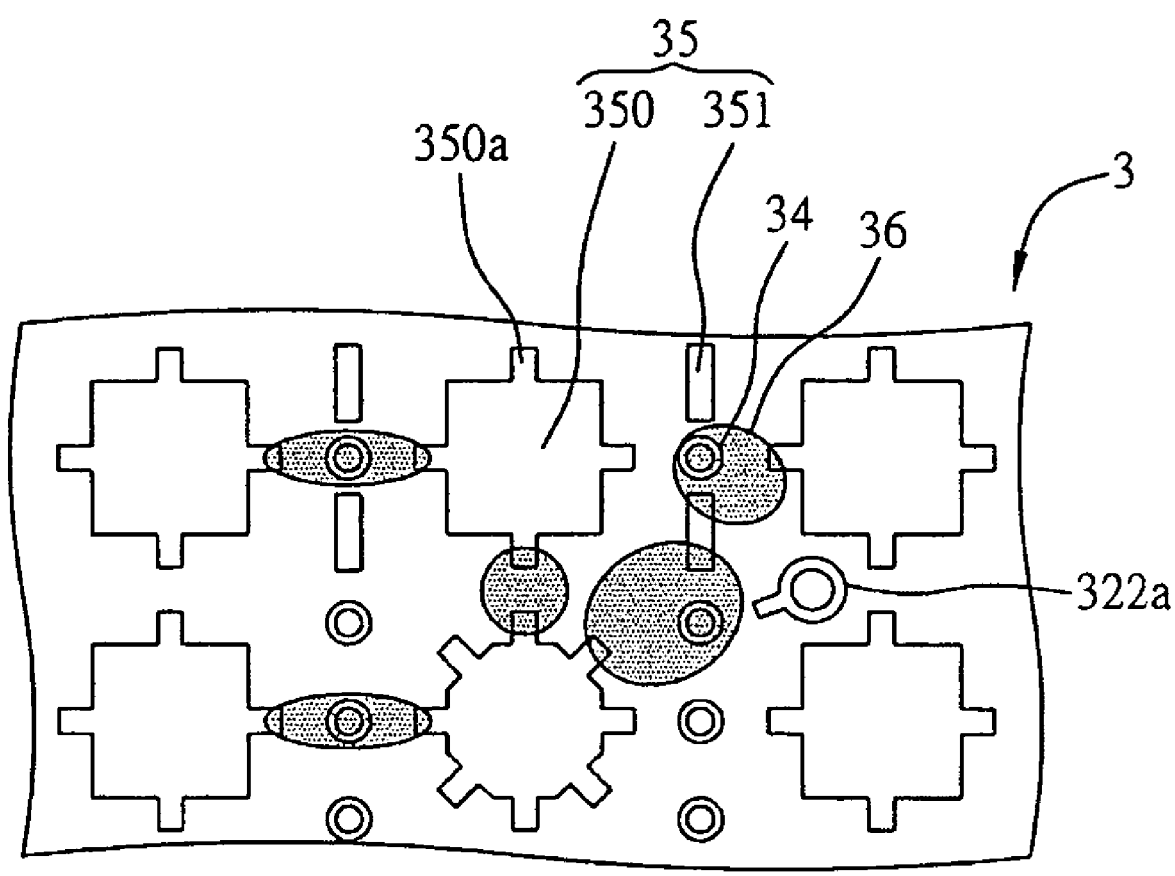
FIG. 4 is a top view of showing the formation of the conductive layer on the surface of the circuit board with embedded selectable passive components for electrically connecting to the passive components according to the present invention.

FIGS. 3A, 3B and FIG. 4 are schematic diagrams showing the method for fabricating the circuit board structure with embedded selectable passive components.

As shown in FIG. 3A, a multi-layer circuit board 3 is provided. The circuit board 3 includes a plurality of circuit layers 31 and interlayer electric structures (for example, conductive vias 321, plated through holes 322 and the like) for electrically connecting the circuit layers 31. A plurality of passive components 33 are embedded between laminations of the circuit board 3, wherein the passive components 33 may be a set of capacitors, resistors, or inductors, and the passive components 33 that have been processed may be selected to adhere between laminations of the circuit board during the interlayer circuit process of the circuit board 3 or the passive components which are directly made of passive components material may be selected to form between laminations of the circuit board. The related method for fabricating passive components between laminations of the circuit is prior art and is not the primary technical characteristic of the present invention, thus it is not described herein.

Furthermore, a plurality of interlayer electric structures such as conductive vias 321 or plated through holes 322 is formed between laminations of the circuit board 3. The interlayer electric structures can electrically connect to the circuit layers 31 and the passive components 33, and electrically extend the conductive vias 321 that are electrically connected to the passive components 33 and circuit layers 31 for forming electrical connections 34. Additionally, a circuit structure 35 is formed on the surface of the circuit board 3, wherein the circuit structure 35 includes electrode pads 350 for subsequently electrically connecting the electrical connections 34 and conductive circuit 351 for transmitting electrical signals (as shown in FIG. 3B). The electrode pad 350 optimally includes at least one extension portion 350a (shown in FIG. 4) for selectively forming connection with the adjacent conductive circuit 351 and the electrical connections 34 via the conductive layer. Additionally, a plurality of plated through holes 322a may also be formed to electrically connect the circuit structure on the upper and lower surfaces.

As shown in FIG. 4, a conductive layer 36 is selectively formed on the surface of the circuit board 3 between the electrical connections 34 and the circuit structure 35 to electrically connect the passive components according to different electrical situations, so as to provide a set of passive components for electrical design of electronic devices. Wherein the conductive layer 36 may be solder paste for electrically connecting the electrical connections 34 and circuit structure 35 by a reflow process, or may be silver paste, copper paste, and the like for electrically connecting the electrical connections 34 and circuit structure 35 by a baking process. And the conductive layer 36 can also be formed by electroplating or electroless plating.

As the circuit structure 35 includes a plurality of electrode pads 350 and conductive circuits 351 set around the electrode pads 350 and extension portions 350a extended at the periphery of the electrode pads 350, only the conductive layer 36 may be formed between the extension portion 350a which is extended at the periphery of the electrode pads 350 and the conductive circuits 351 which is set around the electrode pads 350 according to different electrical situations, so a portion of the passive components formed on the circuit board may be electrically connected to achieve the desired electrical design.

Moreover, a plurality of plated through holes 322a may be formed on the circuit board 3 to electrically connect the circuit structure 35 on the upper and lower surfaces, so as to further provide flexibility in altering the electrical design. Furthermore, the electrode pads 350 are not limited to being made as the tabbed rectangular shape shown in the FIG. 4 but can also be made as any other polygons or shapes.

The present invention also provides a circuit board structure with embedded selectable passive components by the foregoing method which mainly comprises: a circuit board 3 with a plurality of embedded selectable passive components 33; a plurality of electrical connections 34 formed on the surface of the circuit board 3 for electrically connecting to the passive components 33 by interlayer electric structures formed on the circuit board 3; a circuit structure 35 formed on the surface of the circuit board 3 close to the electrical connections 34; and a plurality of conductive layers 36 selectively formed between the electrical connections 34 and the circuit structure 35.

Therefore, the circuit board structure with embedded selectable passive components and a method for fabricating the same mainly comprises: embedding a plurality of passive components in the circuit board; forming electrical connections extended from the passive components on the surface of the circuit board and forming a circuit structure which includes a plurality of electrode pads and conductive circuits partly connected to the electrode pads; thereafter, selectively forming conductive layer between the electrical connection on the surface of the circuit board and the circuit structure according to different electrical designs (including electrical connection between conductive circuits of the circuit structure), so as to provide an electrical conductive connection and an electrical set of passive components. Specifically, the capacitance value for the electrical design can be achieved if the embedded passive component is a capacitor, the resistance value for the electrical design can be achieved if the embedded passive component is a resistor, and the inductance value for the electrical design can be achieved if the embedded passive component is an inductor. Furthermore, the passive components embedded in the circuit board may be incorporated with one set of capacitors, resistors and inductors for complying with different electrical requirements of electronic devices. Accordingly, desired passive components can be electrically connected by the conductive layers formed between the electrical connections on the surface of the circuit board and the circuit structure according to the electrical design. Thus, pre-connections of the passive components not used to alter and correct electrical performance are not needed during circuit board processes.

Only a part of the passive components are shown in the drawings. It should be understood that the number and positions of the passive components embedded in the circuit board can be flexibly arranged according to practical requirements. The foregoing descriptions of the detailed embodiment are only made to disclose the features and functions of the present invention and not restrictive of the scope of the present invention. It should be understood to those in the art that various modifications and variations according to the spirit and principle in the disclosure of the present invention should fall within the scope of the appended claims.

What is claimed is:

1. A circuit board structure with embedded selectable passive components, comprising:
   a circuit board with embedded passive components;
   a plurality of electrical connections formed on a top surface of the circuit board and electrically connected to the passive components by interlayer electric structures formed in the circuit board;
   a circuit structure with electrode pads formed on the top surface of the circuit board at a position close to the electrical connections, wherein the electrode pads include at least one extension portion; and
   a plurality of conductive paste selectively formed between the electrical connections and the extension portion of electrode pads of circuit structure for electrically connecting to embedded passive components.

2. The circuit board structure of claim 1, wherein the circuit board further comprises a plurality of circuit layers, and the interlayer electric structures of the circuit board are for electrically connecting the circuit layers.

3. The circuit board structure of claim 2, wherein the interlayer electric structures are conductive vias or plated through holes.

4. The circuit board structure of claim 1, wherein the passive components are selected from the group consisting of capacitors, resistors and inductors.

5. The circuit board structure of claim 1, wherein the passive components are formed by directly adhering fabricated passive components between laminations of the circuit board during an interlayer circuit process of the circuit board.

6. The circuit board structure of claim 1, wherein the passive components are made of a passive component material formed between laminations of the circuit board.

7. The circuit board structure of claim 1, wherein the conductive paste are made of solder paste, silver paste or copper paste for electrically connecting the electrical connections and the circuit structure by a baking process.

8. The circuit board structure of claim 1, wherein the circuit board is formed with plated through holes electrically connecting circuit structures on upper and lower surfaces of the circuit board.

9. A method for fabricating a circuit board structure with embedded selectable passive components, comprising the steps of:

providing a circuit board with embedded passive components;

forming a plurality of electrical connections on a top surface of the circuit board, the electrical connections being electrically connected to the passive components, and forming a circuit structure with electrode pads close to the electrical connections, wherein the electrode pads include at least one extension portion; and selectively forming a conductive paste between the electrical connections and the extension portion of electrode pads of circuit structure to electrically connect a portion of the passive components embedded in the circuit board according to different electrical situations, so as to provide a set of passive components required for electrical design of electronic devices.

10. The method of claim 9, wherein the circuit board further comprises a plurality of circuit layers and interlayer electric structures for electrically connecting the circuit layers.

11. The method of claim 10, wherein the interlayer electric structures are conductive vias or plated through holes.

12. The method of claim 10, wherein the interlayer electric structures provide the passive components with electrical connections electrically extended to the surface of the circuit board.

13. The method of claim 9, wherein the passive components are selected from the group consisting of capacitors, resistors and inductors.

14. The method of claim 9, wherein the passive components are formed by directly adhering fabricated passive components between laminations of the circuit board during an interlayer circuit process of the circuit board.

15. The method of claim 9, wherein the passive components are made of a passive component material formed between laminations of the circuit board.

16. The method of claim 9, wherein the circuit structure includes electrode pads for subsequently electrically connecting the electrical connections and conductive circuits for transmitting electrical signals.

17. The method of claim 16, wherein the electrode pads include at least one extension portion for selectively being electrically connected to the adjacent conductive circuits and electrical connections via the conductive paste.

18. The method of claim 9, wherein the conductive paste is made of solder paste, silver paste or copper paste for electrically connecting the electrical connections and the circuit structure.

19. The method of claim 9, wherein the circuit board is formed with plated through holes electrically connecting circuit structures on upper and lower surfaces of the circuit board.

* * * * *